(12) United States Patent
Kuiri

(10) Patent No.: US 6,639,853 B2
(45) Date of Patent: Oct. 28, 2003

(54) DEFECT AVOIDANCE IN AN INTEGRATED CIRCUIT

(75) Inventor: Tapio Kuiri, Oulu (FI)

(73) Assignee: Nokia Mobile Phones, Ltd., Espoo (FI)

( * ) Notice: Subject to any disclaimer, the term of this patent is extended or adjusted under 35 U.S.C. 154(b) by 0 days.

(21) Appl. No.: 09/971,194

(22) Filed: Oct. 3, 2001

(65) Prior Publication Data

US 2002/0080656 A1 Jun. 27, 2002

(30) Foreign Application Priority Data

Oct. 6, 2000 (GB) .............................. 0024539

(51) Int. Cl.⁷ .............................. G11C 7/00; G11C 8/00
(52) U.S. Cl. .................. 365/200; 365/201; 365/230.03
(58) Field of Search ................................ 365/200, 201, 365/230.01, 230.03

(56) References Cited

U.S. PATENT DOCUMENTS

| | | | | |
|---|---|---|---|---|
| 4,295,149 A | * | 10/1981 | Balyoz et al. .............. | 257/211 |
| 5,068,603 A | * | 11/1991 | Mahoney .................... | 714/726 |
| 5,459,340 A | * | 10/1995 | Anderson et al. ........... | 257/203 |
| 5,862,314 A | | 1/1999 | Jeddeloh ................ | 395/182.06 |
| 5,960,169 A | * | 9/1999 | Styczinski .................. | 711/114 |
| 6,006,022 A | * | 12/1999 | Rhim et al. ................... | 703/26 |
| 6,324,633 B1 | * | 11/2001 | Flake et al. ................. | 711/129 |
| 6,427,222 B1 | * | 7/2002 | Shau ............................. | 716/4 |

FOREIGN PATENT DOCUMENTS

GB    2 166 273 A    4/1986

* cited by examiner

Primary Examiner—Thong Le
(74) Attorney, Agent, or Firm—Perman & Green, LLP

(57) ABSTRACT

A method of using an integrated circuit with at least one defect, said method comprising the steps of determining the location of one or more defects in said integrated circuit; selecting a program to be stored on said integrated circuit, said program being selected on the basis of the location of said one or more defects; and loading said program onto said integrated circuit.

16 Claims, 2 Drawing Sheets

DEFECT AVOIDANCE IN AN INTEGRATED CIRCUIT

BACKGROUND OF THE INVENTION

The present invention relates to a method of using an integrated circuit.

To make an integrated circuit containing a memory, a wafer is formed which contains a number of the integrated circuits. Typically, each wafer will contain between 10 and 1000 such integrated circuits. Integrated circuits containing a memory are generally relatively large compared to other types of integrated circuit. The larger the integrated circuit, the more likely it is that there will be a fault in the integrated circuit. Each integrated circuit contains a high number of devices. For example each integrated circuit may contain millions of devices. Faults are caused during the manufacturing process by dust or other contaminants. While the presence of contaminants during the manufacturing process can be reduced, it is impossible to completely eliminate their presence. A single fault in an integrated circuit may mean that the integrated circuit as a whole is regarded as being non functional and the integrated circuit is discarded. The large number of devices present on each integrated circuit means that the likelihood of at least one fault occurring on the integrated circuit may be relatively high and may be of the order of 50%.

If the yield, that is the number of functioning integrated circuits which can be obtained from a wafer, can be increased, the cost of each integrated circuit is reduced. For example if the yield can be increased from 50% to 90%, the cost savings can be very significant, particularly if a large number of the integrated circuits are required for a consumer product such as a mobile telephone.

Reference is made to U.S. Pat. No. 5,862,314 which addresses the problem of defects in a memory. A computer system is described which includes a memory requester that interfaces with a memory module. The memory module has memory portions. An error map is created and stored in the computer system. The error map identifies those memory portions which have defects. Using the error map, a remapping table is created and stored in the memory module. The remapping table is arranged to map each of the defective memory portions to a non defective memory portion in the memory module. If a request is received from a memory requester requesting access to a memory portion, a determination is made from the error map as to whether or not the requested memory portion is a defect portion or not. If the requested memory portion is a defect portion, then the remapping table is used to determine the memory portion which should now be accessed in response to the request.

This arrangement has the disadvantage that every time a request is made to the memory, a check must be made to see if the requested memory portion is a defect portion and if so the remapping table must be referred to. Thus the memory must additionally store the error table and the remapping table. The operation to access a given memory location may thus take an increased number of cycles.

SUMMARY OF THE INVENTION

It is an aim of embodiments of the present invention to address the problem discussed above.

According to a first aspect of the present invention there is provided a method of using an integrated circuit with at least one defect, said method comprising the steps of determining the location of one or more defects in said integrated circuit; selecting a program to be stored on said integrated circuit, said program being selected on the basis of the location of said one or more defects; and loading said program onto said integrated circuit.

According to a second aspect of the present invention there is provided a method of producing a plurality of integrated circuit devices, wherein each integrated circuit is produced in accordance with the method as set forth above, wherein the function of program stored on each integrated circuit is the same with memory addressing taking into account the location of said defects.

BRIEF DESCRIPTION OF THE DRAWING

For a better understanding of the present invention and as to how the same may be carried into effect, reference will now be made by way of example to the accompanying drawings in which.

DETAILED DESCRIPTION OF THE INVENTION

Figure 1:
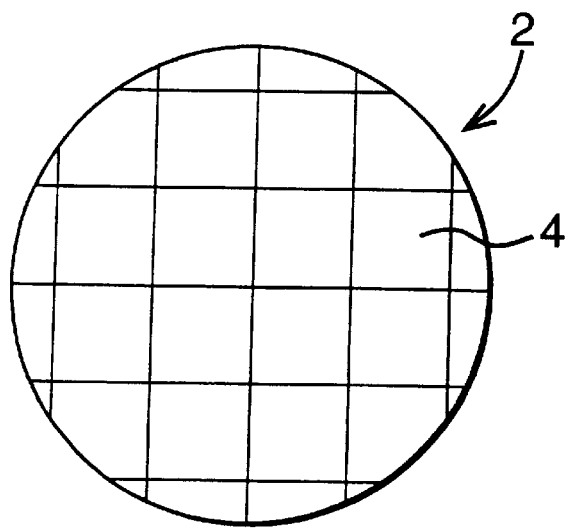
FIG. 1 shows a wafer containing a plurality of integrated circuits.

Reference is made to FIG. 1 which shows a wafer 2 which contains a number of integrated circuits 4. The wafer 2 is manufactured in accordance with known techniques. The techniques are well known and will not be described in any further detail.

Figure 2:
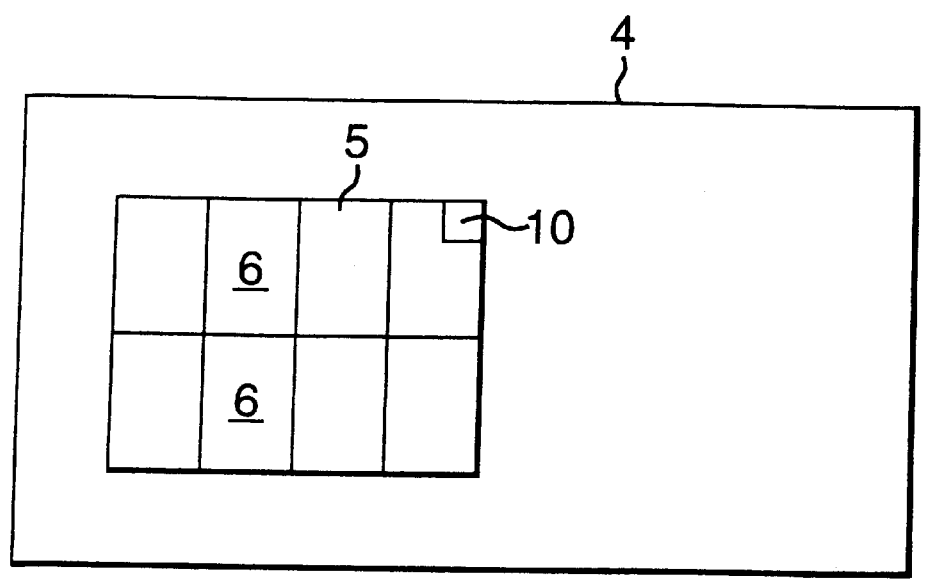
FIG. 2 schematically shows an integrated circuit embodying the present invention.
Figure 3:
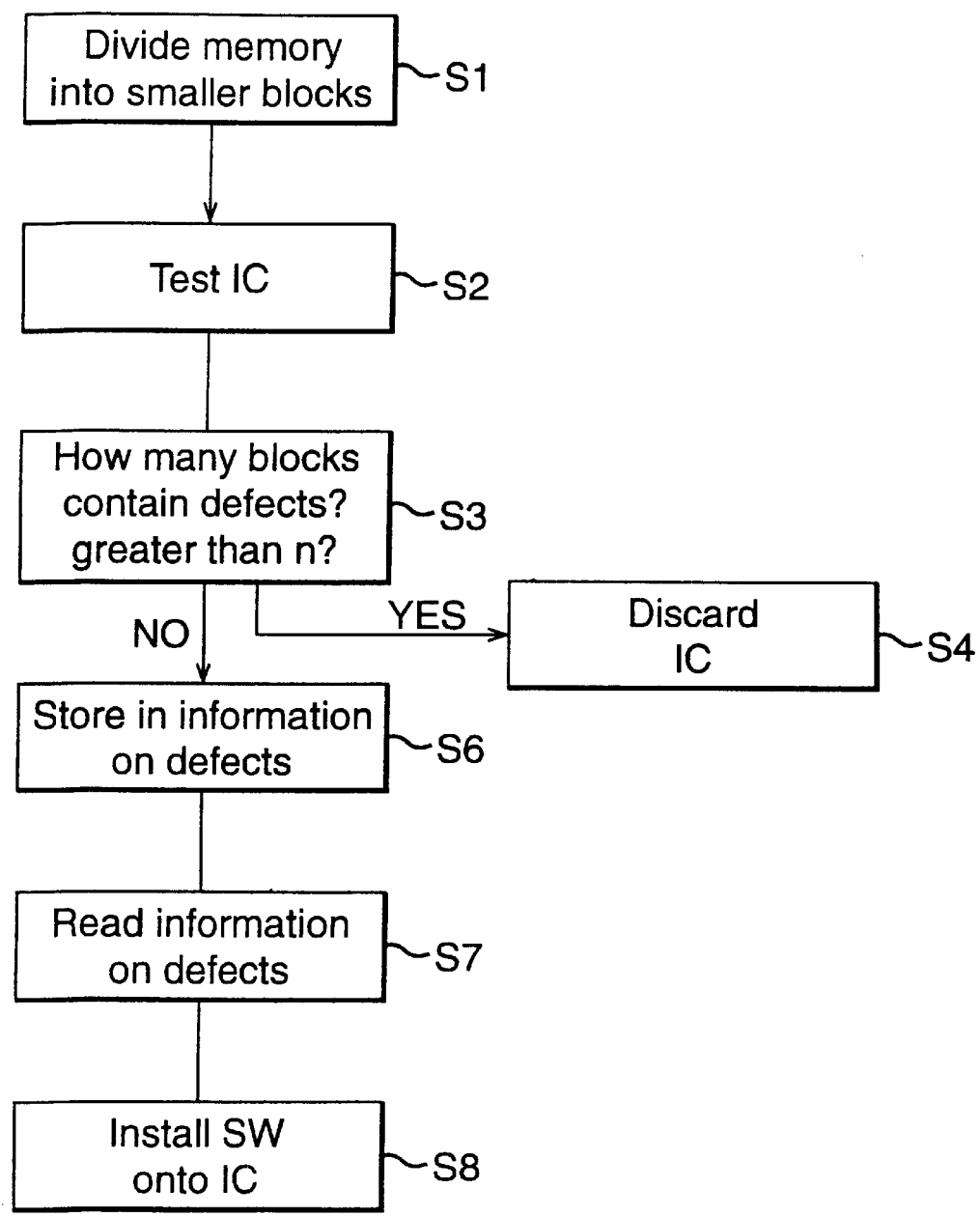
FIG. 3 shows a flow chart of an embodiment of the invention.

During the production phase of the integrated circuit, that is before the integrated circuit is used in a product, the following steps are carried out. Reference will be made to FIG. 2 which shows an integrated circuit and FIG. 3 which shows a flow diagram of a method embodying the invention.

The integrated circuit 4 has a memory 5 which is divided into a plurality of smaller memory blocks 6 (step S1). The size of each memory block 6 is selected in dependence on one or more of the following factors:

The size of the memory

The amount of memory that will actually be required in the application for which the integrated circuit is designed The memory block size may be selected in dependence on any other suitable factor.

The appropriate size of memory block 6 for a given type of integrated circuit can take into account one or more of these factors or may be determined using trial and error, The size of memory block may for example depend on yield rate, If the yield is good, one can define bigger blocks; if the yield is bad, it is better to define small blocks (so that a large amount of memory will not be "lost" with a defect block). With a bigger block size, there is need for more "spare memory" e.g. if you have 10 blocks, one of which may or may not have a defect, 10% spare memory is needed; with 100 smaller blocks—one of which may contain a defect, 1% spare memory is needed. These figures are given by way of example only.

It should be appreciated that the integrated circuit is not necessarily physically divided into these blocks but rather this is a notional division of the memory of the integrated circuit.

In the next step (step S2), the integrated circuit is tested. An integrated circuit is during a conventional processing in any event tested. The testing is arranged to determine if the memory contains any defects. In embodiments of the invention, it is determined in which blocks the defects are contained.

In the next step (step S3), it is determined how many blocks contain defects. A threshold n is set. If more blocks than the defined threshold have defects, then the integrated circuit is rejected and discarded in step S4. If on the other hand, the number of blocks with defects are less than the threshold then the integrated circuit passes the test stage. The threshold is set so that the minimum number of blocks required to provide the required functionality of the integrated circuit are defect free. The number of defects in a given block is not considered in some embodiments of the invention. If a block contains one or more defects, it is regarded as a defect block. In other embodiments the number of defects in a block may be taken into account, when for example determining whether to retain or discard an integrated circuit.

For certain types of memory such as non volatile memory, information about the memory blocks which contain defects is stored in a given location 10 in the memory in step S5. This information will effectively identify the memory blocks which have the defect and/or their location. The location of the defective memory block may be implicitly obtained from the identity of the memory block in question.

If the memory is volatile, then only the number of memory blocks containing memory defects is checked. In this way a decision is made as to whether the integrated circuit is to be retained or discarded.

In the next step (step S6), for non volatile memories, the stored information on the blocks which contain the defects are read from the given location.

The software program to be stored on the integrated circuit is selected and installed in step S7. This is the software program which will be used by the integrated circuit when it is installed in the final product. The software program which is loaded into the integrated circuits, which are to perform the same function, will be functionally the same. However, the memory addressing which is used will be dependent on the location of the blocks containing the defects. Memory mapping defines the locations where different parts of the program are stored. There will be information in the program which will cause the program to fetch instructions or data from a different memory location defined by the memory mapping. This is referred to as memory addressing. This permits the blocks containing the defects to avoided.

A set of software packages can be provided, from which one is selected in dependence on the location of a defect. Alternatively, a "jump table" or memory map in the software package is modified in dependence on the location of the defects.

The software may be loaded into the integrated circuit in final production, that is after the integrated circuit has been installed in the product. In some embodiments of the invention, it is desirable to delay the loading of the software onto the integrated circuit for as long as possible so that last minute changes can be made to the software if required.

In one embodiment of the invention, information on the location of the memory block or blocks containing the defects is obtained from the memory location or using the built in self test facility. The software package containing the memory mapping which allows the blocks containing the defects to be avoided is selected and installed on the integrated circuit.

In one embodiment of the invention, the integrated circuits produced are sorted into batches with each batch containing only integrated circuits with blocks having defects at the same block or blocks of the memory. A unique SW package will be installed for each batch of integrated circuits. Each SW package performs same functionality, however, avoiding defect blocks of the batch by having unique memory addressing. This is particularly advantageous where the number of integrated circuits is relatively high as this may improve the efficiency of the production process.

For alternative embodiments where there is no location which stores information on the location of the defect blocks, built in test circuitry is used to determine the location of the defect blocks. Integrated circuits tend to include built in test circuitry and this can be utilised in embodiments of the present invention. This can usually be done relatively quickly.

Again, once the locations of the block or blocks containing the defects have been identified the software package with the appropriate memory mapping is loaded in the memory. This is as discussed previously.

In another alternative embodiment, the locations of the defect blocks are detected in the production of the final product. This can be done e.g. by first installing a test software into the final product. A suitable SW package is selected and installed into the final product after the software has found the defect blocks. Hence, no test circuitry is required in the integrated circuit.

Thus embodiments of the present invention modify the program stored on the integrated circuit in dependence on the location of the block or blocks containing defects. There is thus no need for error maps or remapping tables in the integrated circuit when it is used in the final product. Thus space in the memory is not wasted on the error maps and remapping tables of the prior art. Additionally, when the integrated circuit is used, there is no need to refer to the error map and remapping table each time a request for access to the memory is made. No check for any defects are required where integrated circuits embodying the invention have had the software installed thereon with the memory mapping appropriate to the location of the defect block or blocks and are being used in the final product.

In one modification to embodiments of the invention, the size of the blocks may be different. However it is preferred that they are the same.

In another modification to embodiments of the present invention, the size of a block may be changed in dependence on the location of a defect and/or the number of defects in a given area. In this case, the memory would also include information as to the size and/or location of the block.

The way that the software and the memory mapping is used may take into account the size of each block which does not contain any defect so that the most effective use of the memory is made, For example a short subroutine may be stored in a small block and a longer subroutine in a larger block. A given subroutine may be stored on either side of a defect in alternative embodiments of the present invention.

In one modification to embodiments of the present invention, each block may comprise a single memory cell.

In one modification to embodiments of the present invention, the software installed on the integrated circuit may include a jump table, The jump table is arranged to store pointers to subroutines. In other words the location of the subroutines in the memory is stored. The location where the subroutines are stored in the memory will depend on the location of the defect block or blocks. The jump table will reflect the location at which the subroutines are actually stored in the integrated circuit in question.

In another alternative embodiment of the invention, an integrated circuit may have more than one memory. The memories may be of different types such as RAM and flash memories. The software or the like may be modified so that the software is not located into blocks containing defects in the flash memory and so that it will not use blocks containing defects in the RAM.

In embodiments of the present invention, the integrated circuits may be designed to have a larger memory capacity than is required for the application of the integrated circuit. This means that the loss of one or more blocks will not prevent the memory from storing all the information which it requires in order to function correctly when installed in the final product.

Embodiments of the present invention can be used to produce digital ASICs (application specific integrated circuit). The ASIC can include any suitable type of memory such as ROM (read only memory), RAM (random access memory), flash memory, DRAM (dynamic random access memory), SRAM (static random access memory), or non volatile programmable memory such as PROM (programmable random access memory), EEPROM (electrically erasable programmable read only memory), EPROM (electrically programmable read only memory) and EAROM. (electrically alterable read only memory). Embodiments of the invention may be any other suitable type of integrated circuit and not necessarily an ASIC.

It should be appreciated that whilst preferred embodiments of the present invention have been described in the context of an integrated circuit containing a memory, embodiments of the present invention may be used with other types of integrated circuit which suffer from the same problems.

What is claimed is:

1. A method of using an integrated circuit with at least one defect, said method comprising the steps of:
   determining the location of one or more defects in said integrated circuit;
   selecting a program to be stored on said integrated circuit, said program being selected on the basis of the location of said one or more defects; and
   loading said program onto said integrated circuit.

2. The method as claimed in claim 1, wherein said determining step comprises dividing at least part of said integrated circuit into a plurality of notional blocks and the one or more blocks containing said one or more defects is determined.

3. The method as claimed in claim 2 comprising the steps of determining the number of blocks containing one or more defects and if the number of blocks containing one or more defects is greater than a threshold, discarding said integrated circuit.

4. The method as claimed in claim 1, comprising the step of storing information relating to the location of said defects at a location on said integrated circuit.

5. The method as claimed in claim 1, comprising the step of identifying the location of said one or more defects using built in self test circuitry of said integrated circuit.

6. The method as claimed in claim 1, wherein said integrated circuit comprises a memory.

7. The method as claimed in claim 6, wherein said memory is a volatile memory.

8. The method as claimed in claim 6, wherein said memory is in non volatile memory.

9. The method as claimed in claim 1, wherein said integrated circuit is an ASIC.

10. A method of producing a plurality of integrated circuit devices, wherein each integrated circuit is produced in accordance with the method as claimed in claim 1, wherein the function of program stored on each integrated circuit is the same with memory addressing taking into account the location of said defects.

11. The method as claimed in claim 10, wherein said determining step comprises dividing at least part of the integrated circuit into a plurality of notional blocks and the one or more blocks containing said one or more defects is determined.

12. The method has claimed in claim 11, wherein said integrated circuits are sorted into a plurality of batches, with each batch containing integrated circuits with defects in the same block, each batch of integrated circuits being programmed with the same program with the same memory addressing.

13. A method of producing an integrated circuit, said method comprising the steps of:
   dividing at least part of said integrated circuit into a plurality of notional blocks;
   determining the number of blocks containing one or more defects; and
   if the number of blocks containing one or more defects is greater than a threshold, discarding said integrated circuit.

14. A method of using an integrated circuit with at least one defective part, said defective part being present upon completion of manufacture of the integrated circuit, the method comprising the steps of:
   determining the location of each of said at least one defective part in said integrated circuit;
   selecting a program to be stored on said integrated circuit, said program being based on the location of each defective part for enabling utilization of said integrated circuit with avoidance of each defective part; and
   loading said program onto said integrated circuit.

15. A method of using an integrated circuit with at least one defective part, said defective part being present upon completion of manufacture of the integrated circuit, the method comprising the steps of:
   determining the location of each of said at least one defective part in said integrated circuit;
   selecting a program to be stored on said integrated circuit, said program being based on the location of each defective part for enabling utilization of said integrated circuit with utilization of each defective part in a modified mode of operation; and
   loading said program onto said integrated circuit.

16. A method according to claim 15 wherein said at least one defective part is a memory comprising a plurality of blocks of memory of which one block is defective, and the modified mode of operation of said memory provides for a mapping of stored data into the memory blocks with avoidance of the defective memory block.

* * * * *